US007455953B2

(12) United States Patent
Verschueren et al.

(10) Patent No.: US 7,455,953 B2

(45) Date of Patent: Nov. 25, 2008

(54) POSITIVE WORKING HEAT-SENSITIVE LITHOGRAPHIC PRINTING PLATE PRECURSOR

(75) Inventors: Veerle Verschueren, Schilde (BE); Joan Vermeersch, Deinze (BE); Huub Van Aert, Pulderbos (BE); Eric Verschueren, Merksplas (BE)

(73) Assignee: Agfa Graphics, N.V., Mortsel (BE)

( * ) Notice: Subject to any disclaimer, the term of this patent is extended or adjusted under 35 U.S.C. 154(b) by 60 days.

(21) Appl. No.: 10/808,812

(22) Filed: Mar. 25, 2004

(65) Prior Publication Data

US 2004/0191675 A1 Sep. 30, 2004

Related U.S. Application Data

(60) Provisional application No. 60/463,702, filed on Apr. 17, 2003.

(30) Foreign Application Priority Data

Mar. 28, 2003 (EP) .................................. 03100810

(51) Int. Cl.
*G03F 7/00* (2006.01)
*G03F 7/004* (2006.01)

(52) U.S. Cl. ..................... 430/302; 430/270.1; 430/950

(58) Field of Classification Search .............. 430/270.1, 430/302

See application file for complete search history.

(56) References Cited

U.S. PATENT DOCUMENTS

| | | | | |
|---|---|---|---|---|
| 4,560,636 | A * | 12/1985 | Stahlhofen | 430/165 |
| 6,238,831 | B1 | 5/2001 | Hauck et al. | |
| 6,352,812 | B1 | 3/2002 | Shimazu et al. | |
| 6,457,413 | B1 * | 10/2002 | Loccufier et al. | 101/466 |
| 6,593,057 | B2 * | 7/2003 | Kita | 430/270.1 |
| 6,673,435 | B1 * | 1/2004 | Tashiro et al. | 428/328 |
| 6,706,463 | B2 * | 3/2004 | Inno et al. | 430/302 |
| 6,800,417 | B2 * | 10/2004 | Kikuchi | 430/270.1 |
| 6,821,704 | B1 * | 11/2004 | Ide et al. | 430/270.1 |

FOREIGN PATENT DOCUMENTS

| | | | |
|---|---|---|---|
| EP | 0 832 739 | A1 | 4/1998 |
| EP | 0 950 514 | A1 | 10/1999 |
| EP | 0 950 516 | A1 | 10/1999 |
| EP | 1 101 608 | A1 | 5/2001 |
| EP | 1 157 829 | A1 | 11/2001 |
| EP | 1 241 003 | A2 | 9/2002 |

OTHER PUBLICATIONS

Search Report for EP 03 10 0810 (Sep. 1, 2003).

* cited by examiner

*Primary Examiner*—Amanda C. Walke
(74) *Attorney, Agent, or Firm*—Leydig, Voit & Mayer, Ltd

(57) ABSTRACT

A positive working heat-sensitive lithographic printing plate precursor is disclosed which comprises a support having a hydrophilic surface and a coating, provided on the hydrophilic surface, wherein the coating comprises a spacer particle comprising aluminum hydroxide or aluminum oxide and having an average particle size larger than 0.3 μm, for improving the scuff-mark resistance of the coating. Furthermore, the coating comprises an infrared light absorbing agent, an oleophilic resin soluble in an aqueous alkaline developer and a developer resistant means.

14 Claims, No Drawings

POSITIVE WORKING HEAT-SENSITIVE LITHOGRAPHIC PRINTING PLATE PRECURSOR

CROSS-REFERENCE TO RELATED PATENT APPLICATIONS

This application claims the benefit of U.S. Provisional Application No. 60/463,702 filed Apr. 17, 2003, which is incorporated by reference. In addition, this application claims the benefit of European Application No. 03100810.5 filed Mar. 28, 2003, which is also incorporated by reference.

FIELD OF THE INVENTION

The present invention relates to a positive working heat-sensitive lithographic printing plate precursor that comprises an aluminum hydroxide or aluminum oxide spacer particle, having a particle size larger than 0.3 μm.

BACKGROUND OF THE INVENTION

Lithographic printing presses use a so-called printing master such as a printing plate which is mounted on a cylinder of the printing press. The master carries a lithographic image on its surface and a print is obtained by applying ink to said image and then transferring the ink from the master onto a receiver material, which is typically paper. In conventional lithographic printing, ink as well as an aqueous fountain solution (also called dampening liquid) are supplied to the lithographic image which consists of oleophilic (or hydrophobic, i.e. ink-accepting, water-repelling) areas as well as hydrophilic (or oleophobic, i.e. water-accepting, ink-repelling) areas. In so-called driographic printing, the lithographic image consists of ink-accepting and ink-abhesive (ink-repelling) areas and during driographic printing, only ink is supplied to the master.

Printing masters are generally obtained by the so-called computer-to-film method wherein various pre-press steps such as typeface selection, scanning, color separation, screening, trapping, layout and imposition are accomplished digitally and each color selection is transferred to graphic arts film using an image-setter. After processing, the film can be used as a mask for the exposure of an imaging material called plate precursor and after plate processing, a printing plate is obtained which can be used as a master.

A typical printing plate precursor for computer-to-film methods comprise a hydrophilic support and an image-recording layer of a photosensitive polymer layers which include UV-sensitive diazo compounds, dichromate-sensitized hydrophilic colloids and a large variety of synthetic photopolymers. Particularly diazo-sensitized systems are widely used. Upon image-wise exposure, typically by means of a film mask in a UV contact frame, the exposed image areas become insoluble and the unexposed areas remain soluble in an aqueous alkaline developer. The plate is then processed with the developer to remove the diazonium salt or diazo resin in the unexposed areas. So the exposed areas define the image areas (printing areas) of the printing master, and such printing plate precursors are therefore called ‘negative-working’. Also positive-working materials, wherein the exposed areas define the non-printing areas, are known, e.g. plates having a novolac/naphtoquinone-diazide coating which dissolves in the developer only at exposed areas.

In addition to the above photosensitive materials, also heat-sensitive printing plate precursors are known. Such materials offer the advantage of daylight stability and are especially used in the so-called computer-to-plate method wherein the plate precursor is directly exposed, i.e. without the use of a film mask. The material is exposed to heat or to infrared light and the generated heat triggers a (physico-) chemical process, such as ablation, polymerization, insolubilization by cross-linking of a polymer or by particle coagulation of a thermoplastic polymer latex, and solubilization by the destruction of intermolecular interactions.

EP 950,514 describes a heat mode imaging element for making a positive working lithographic printing plate wherein a hydrophilic surface of the support is coated with a first layer, comprising a polymer, soluble in an aqueous alkaline solution, and a top layer which is IR-sensitive and unpenetrable for an alkaline developer. The top layer comprises a polymer that lowers the dynamic friction coefficient of the top layer to a value less than 0.37 for improving the transport to the laser drum. Such polymers may be selected from polytetrafluoroethylene or poly(alkyl)acrylates.

EP 1,101,608 describes a positive-working heat imagable precursor comprising a polymeric coating on a substrate. The polymeric coating comprises polymeric particles, selected from polyolefins and halogenated, especially fluorinated, polyolefins, for example of polyethylene or polytetrafluoroethylene. The particles are dispersed in a polymeric matrix, for example a phenolic resin. The polymeric particles are insoluble in the organic solvent of the coating and increase the physical robustness of the layer.

U.S. Pat. No. 6,238,831 describes the preparation of an offset printing plate with high printing run stability wherein the photosensitive layer contains homogeneously distributed polymeric particles. The polymer of these polymeric particles is first solubilised in the coating solution as a homogeneously solubilised phase and, during the drying process of the coating solution, polymeric particles are “in-situ” formed in the layer.

EP-A-1,157,829 describes the preparation of a lithographic printing plate which comprises a photosensitive composition wherein fine polymeric particles are dispersed in an aqueous resin composition. The polymeric particles are composed of a resin, having neutralised anionic groups and having a heat fusion property. When the photosensitive composition is irradiated by light, the fine polymeric particles are melted, fused and denaturated by the thermal energy so that only these irradiated area do not dissolve in the developer on processing.

U.S. Pat. No. 6,352,812 describes the preparation of a thermal lithographic printing plate which comprises on a hydrophilic surface of a support a composite layer structure composed of two layer coatings. The first layer is composed of aa aqueous developable polymer mixture containing a photothermal conversion material. The second layer is composed of one or more non-aqueous soluble polymers which are soluble or dispersible in a solvent which does not dissolve the first layer. The second layer may also contain polymeric particles, such as poly tetrafluoroethylene particles.

EP-A 0 832 739 describes a method for making a driographic printing plate comprising on a ink-accepting support an image-forming layer containing hydrophobic thermoplastic polymer particles and a compound capable of converting light into heat. The particles have a coagulation temperature above 35° C. and are preferably selected from polyethylene or polymethyl(meth)acrylate.

EP 950,516 describes a heat mode imaging element for making a lithographic printing plate wherein a hydrophilic surface of the support is coated with a first layer, comprising a polymer, soluble in an aqueous alkaline solution, and a top layer which is IR-sensitive and unpenetrable for an alkaline developer. The top layer comprises a compound that increases the dynamic friction coefficient of the top layer to a value between 0.40 and 0.80 for improving transport characteristics of the plate. Such compounds may be selected from a copolymer of polytetrafluoroethylene-propylene, a water insoluble inorganic compound having a three-dimensional structure with siloxane bonds, silica particles or hydrophobic ceramics.

SUMMARY OF THE INVENTION

In a typical industrial process, after coating and drying the lithographic thermal printing plate materials are stacked with or without an interleave in between the plates. Further, the plates with or without the interleaves are handled in packaging equipment for cutting and packaging. During these processes the plates with or without the interleaves are moved relatively to each other whereby the thermal sensitive coating is rubbed. When packed, there might also be a void volume to enable fast automatic packaging in boxes and this free volume allows the plates also to move relatively to each other during transport, causing rubbing of the thermal sensitive coating. The major problems associated with the prior art materials is that they are easily damaged by these mechanical actions, e.g. rubbing, resulting in scuff-marks, due to a destruction of the surface of the thermal sensitive coating of the plate precursor. Prior art materials with incorporated particles, such Teflon particles or silica particles, are also not suitable, because these materials suffer from a low differentiation between the development kinetics of exposed and non-exposed areas—i.e. the dissolution of the exposed coating in the developer is not completely finished before the unexposed coating also starts dissolving in the developer. This leads to low lithographic printing quality showing e.g. toning (ink-acceptance in exposed hydrophilic areas).

It is an aspect of the present invention to provide a heat-sensitive lithographic printing plate precursor comprising a heat-sensitive coating with improved scuff-mark resistance. This object is realized by the precursor as defined in claim 1, having the characteristic feature that the heat-sensitive coating of the precursor comprises spacer particles which comprise aluminum hydroxide or aluminum oxide and have an average particle size larger than 0.3 μm.

Specific embodiments of the invention are defined in the dependent claims.

DETAILED DESCRIPTION OF THE INVENTION

In accordance with the present invention, there is provided a positive working heat-sensitive lithographic printing plate precursor comprising a support having a hydrophilic surface and a coating, provided on the hydrophilic surface, wherein said coating comprises an infrared light absorbing agent, an oleophilic resin soluble in an aqueous alkaline developer, a developer resistance means and spacer particles which comprise aluminum hydroxide or aluminum oxide and have a particle size larger than 0.3 μm.

According to a preferred embodiment of the present invention, the aluminum hydroxide or aluminum oxide particles have a particle size larger than 0.4 μm, more preferably a particle size between 0.5 μm and 20 μm, most preferably a particle size between 1 μm and 7 μm.

It is also an aspect of the present invention that the coating comprising these spacer particles has an increased scuff-mark resistance and an improved differentiation between the development kinetics of exposed and non-exposed areas due to the specified type and size of the spacer particles. The scuff-mark resistance can be measured by the test described in the examples and the differentiation between the development kinetics of exposed and non-exposed areas can be measured by the appearance of toning during printing.

A method suitable for measuring the scuff-mark resistance, hereinafter also referred to as SMR, is described in the examples. A precursor in accordance with the present invention is characterized by a SMR rating of 1, 2 or 3.

The particle size in the present invention is meant as the average particle size and may be measured by a laser diffraction particle analyzer such as the Coulter LS Particle Size Analyzer, e.g. the Coulter LS-230, commercially available by Beckman Coulter Inc. The average particle size is here usually defined as the mean or median of the volume distribution of particle size.

Examples of aluminum hydroxide or aluminum oxide particles are:

P-01: MICRAL 632, an aluminumtrihydroxide particle with an average particle size of 3.5 μm, commercially available from J M HUBER Corporation.

P-02: HYDRAL 710, an aluminumtrihydroxide particle with an average particle size of 1 μm, commercially available from ALCOA CHEMIE Div.

P-03: HYDRAL PGA, an aluminumtrihydroxide particle with an average particle size of 1 μm, commercially available from ROLAND NV.

In accordance with another embodiment of the present invention, the coating has a layer thickness greater than 0.5 $g/m^2$, more preferably the layer thickness is comprised between 0.6 $g/m^2$ and 2.8 $g/m^2$.

The amount of spacer particles may depend on the size of the particles used in the material, e.g. a lower amount of particles may be used with an increased particle size, and on the layer thickness of the coating, e.g. a higher amount of particles may be used with increased thickness of the coating layer. According to the present invention, the amount of the particles in the coating layer is preferably comprised between 5 $mg/m^2$ and 200 $mg/m^2$, more preferably between 10 $mg/m^2$ and 150 $mg/m^2$, most preferably between 20 $mg/m^2$ and 120 $mg/m^2$.

If the coating is composed of two or more separately coated layers, at least one of these coating layers may comprise spacer particles. Depending on which coating layer(s) wherein the spacer particles are present, the particle size and the amount of particles are specifically selected. Typically, spacer particles, if present in the coating solution of a top layer, may have a smaller particle size and may contain less particles in comparison with spacer particles present in a main coating layer, i.e. a layer between the support and the top layer.

It is important for obtaining a significant effect that a sufficient amount of these spacer particles extends the surface of the coating to prevent damaging the surface of the coating by rubbing with an interleave or with the back side of another printing plate.

In accordance with another embodiment of the present invention, there is provided a stack comprising a plurality of these positive working heat-sensitive lithographic printing plate precursors wherein adjacent plate precursors are separated by an interleave.

The interleave is preferably a foil or a film material. Examples of such materials are a paper, a plastic foil or film, a material composed of a paper with a plastic film, or a plastic material obtained by (co)extrusion. The plastic foil or film may be a (co)polymeric material such as polyester, polypropylene, polyethylene, polystyrene, polycarbonate, cellulose acetate, poly(meth)acrylate or polyurethane. The interleave has preferably a thickness value between 10 gsm and 500 gsm, more preferably between 20 gsm and 300 gsm, most preferably between 30 gsm and 200 gsm. A typical example is a paper, containing 100% of wood pulp, a paper not containing 100% of wood pulp but containing synthetic pulp, a paper having a low density polyethylene layer provided on the surface of the above paper, and the like. A more specific example is a paper sheet which is made from bleached kraft pulp and has a basic weight of 30 to 60 gsm, a density of 0.7 to 0.85 g/$cm^3$ and a pH of 4 to 6.

In a preferred embodiment of the present invention, the interleave is placed on top of the coating or on the back side of the support of the precursor, opposite to the coating, more preferred the interleave is placed on top of said coating.

In the present invention the interleave and the printing plate precursor are brought in contact with each other, preferably with pressure. In this process, the interleave and/or the precursor may optionally be treated, e.g. with heat or electrical charges, and this electrically charging or heating of materials may be carried out just before or in-situ contacting the two materials.

In a preferred embodiment of the present invention, a method for producing a stack of the positive working heat-sensitive lithographic printing plate precursor and the interleave is disclosed, comprising the following steps:

coating and drying the coating on the support having a hydrophilic surface, placing the interleave on top of the coating or on the back side of the support, opposite to the coating, cutting the precursor with the interleave and stacking the cutted precursor with the interleave.

According to another preferred embodiment of the present invention, a package comprising a stack of a plurality of these positive working heat-sensitive lithographic printing plate precursors, wherein adjacent plate precursors are separated by an interleave, is disclosed.

According to the present invention, the use of aluminum hydroxide or aluminum oxide spacer particles, having an average particle size larger than 0.3 μm, in the coating of the printing plate precursor for improving the scuff-mark resistance of the coating is disclosed.

According to the present invention, the printing plate precursor comprising a support having a hydrophilic surface and a coating, is positive-working. In such an embodiment, one or more layers of the coating are capable of heat-induced solubilization, i.e. they are resistant to the developer and ink-accepting in the non-exposed state and become soluble in the developer upon exposure to heat or infrared light to such an extent that the hydrophilic surface of the support is revealed thereby. So after exposure and development, the exposed areas are removed from the support and define hydrophilic, non-image (non-printing) areas, whereas the unexposed areas are not removed from the support and define an oleophilic image (printing) area.

The solubility differentiation between image (printing, oleophilic) and non-image (non-printing, hydrophilic) areas of the lithographic image is characterized by a kinetic rather than a thermodynamic effect, i.e. the non-image areas are characterized by a faster dissolution in the developer than the image-areas. In a most preferred embodiment, the non-image areas dissolve completely in the developer before the image areas are attacked so that the latter are characterized by sharp edges and high ink-acceptance. The time difference between completion of the dissolution of the non-image areas and the onset of the dissolution of the image areas is preferably longer than 10 seconds, more preferably longer than 20 seconds and most preferably longer than 60 seconds, thereby offering a wide development latitude.

The support of the lithographic printing plate precursor has a hydrophilic surface or is provided with a hydrophilic layer. The support may be a sheet-like material such as a plate or it may be a cylindrical element such as a sleeve which can be slid around a print cylinder of a printing press. Preferably, the support is a metal support such as aluminum or stainless steel. The support can also be a laminate comprising an aluminum foil and a plastic layer, e.g. polyester film.

A particularly preferred lithographic support is an electrochemically grained and anodized aluminum support. Graining and anodization of aluminum is well known in the art. The anodized aluminum support may be treated to improve the hydrophilic properties of its surface. For example, the aluminum support may be silicated by treating its surface with a sodium silicate solution at elevated temperature, e.g. 95° C. Alternatively, a phosphate treatment may be applied which involves treating the aluminum oxide surface with a phosphate solution that may further contain an inorganic fluoride. Further, the aluminum oxide surface may be rinsed with a citric acid or citrate solution. This treatment may be carried out at room temperature or may be carried out at a slightly elevated temperature of about 30 to 50° C. A further interesting treatment involves rinsing the aluminum oxide surface with a bicarbonate solution. Still further, the aluminum oxide surface may be treated with polyvinylphosphonic acid, polyvinylmethylphosphonic acid, phosphoric acid esters of polyvinyl alcohol, polyvinylsulfonic acid, polyvinylbenzenesulfonic acid, sulfuric acid esters of polyvinyl alcohol, and acetals of polyvinyl alcohols formed by reaction with a sulfonated aliphatic aldehyde. It is further evident that one or more of these post treatments may be carried out alone or in combination. More detailed descriptions of these treatments are given in GB-A-1 084 070, DE-A-4 423 140, DE-A-4 417 907, EP-A-659 909, EP-A-537 633, DE-A-4 001 466, EP-A-292 801, EP-A-291 760 and U.S. Pat. No. 4,458,005.

According to another embodiment, the support can also be a flexible support, which is provided with a hydrophilic layer, hereinafter called 'base layer'. The flexible support is e.g. paper, plastic film, thin aluminum or a laminate thereof. Preferred examples of plastic film are polyethylene terephthalate film, polyethylene naphthalate film, cellulose acetate film, polystyrene film, polycarbonate film, etc. The plastic film support may be opaque or transparent. The base layer is preferably a cross-linked hydrophilic layer obtained from a hydrophilic binder cross-linked with a hardening agent such as formaldehyde, glyoxal, polyisocyanate or a hydrolyzed tetra-alkylorthosilicate. Particular examples of suitable hydrophilic base layers for use in accordance with the present invention are disclosed in EP-A-601 240, GB-P-1 419 512, FR-P-2 300 354, U.S. Pat. No. 3,971,660, and U.S. Pat. No. 4,284,705.

According to the present invention, the oleophilic resin soluble in an aqueous alkaline developer is a binder having acidic groups with a pKa of less than 13 to ensure that it is soluble or at least swellable in aqueous alkaline developers. The binder is preferably a phenolic resin. Advantageously, the binder is a polymer or polycondensate having free phenolic hydroxyl groups, as obtained, for example, by reacting phenol, resorcinol, a cresol, a xylenol or a trimethylphenol with aldehydes, especially formaldehyde, or ketones. The polymers may additionally contain units of other monomers which have no acidic units. Such units include vinylaromatics, methyl (meth)acrylate, phenyl(meth)acrylate, benzyl (meth)acrylate, methacrylamide or acrylonitrile. In a preferred embodiment, the phenolic resin is a novolac, a resole or a polyvinylphenol. The novolac is preferably a cresol/formaldehyde or a cresol/xylenol/formaldehyde novolac, the amount of novolac advantageously being at least 50% by weight, preferably at least 80% by weight, based in each case on the total weight of all binders. The amount of the phenolic resin is advantageously from 40 to 99.8% by weight, preferably from 70 to 99.4% by weight, particularly preferably from 80 to 99% by weight, based in each case on the total weight of the nonvolatile components of the coating.

The dissolution behavior of the oleophilic resin in the developer can be fine-tuned by optional solubility regulating components. More particularly, development accelerators and development inhibitors can be used. These ingredients can be added to the layer which comprises the oleophilic resin and/or to (an)other layer(s) of the coating.

Development accelerators are compounds which act as dissolution promoters because they are capable of increasing the dissolution rate of the oleophilic resin. For example, cyclic acid anhydrides, phenols or organic acids can be used in order to improve the aqueous developability. Examples of the cyclic acid anhydride include phthalic anhydride, tetrahydrophthalic anhydride, hexahydrophthalic anhydride, 3,6-endoxy-4-tetrahydro-phthalic anhydride, tetrachlorophthalic anhydride, maleic anhydride, chloromaleic anhydride, alpha-phenylmaleic anhydride, succinic anhydride, and pyromellitic anhydride, as described in U.S. Pat. No. 4,115,128. Examples of the phenols include bisphenol A, p-nitrophenol, p-ethoxyphenol, 2,4,4'-trihydroxybenzophenone, 2,3,4-trihydroxy-benzophenone, 4-hydroxybenzophenone, 4,4',4"-trihydroxy-triphenylmethane, and 4,4',3",4"-tetrahydroxy-3,5,3',5'-tetramethyltriphenyl-methane, and the like. Examples of the organic acids include sulfonic acids, sulfinic acids, alkylsulfuric acids, phosphonic acids, phosphates, and carboxylic acids, as described in, for example, JP-A Nos. 60-88,942 and 2-96,755. Specific examples of these organic acids include p-toluenesulfonic acid, dodecylbenzenesulfonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluic acid, 3,4-dimethoxybenzoic acid, 3,4,5-trimethoxybenzoic acid, 3,4,5-trimethoxycinnamic acid, phthalic acid, terephthalic acid, 4-cyclohexene-1,2-dicarboxylic acid, erucic acid, lauric acid, n-undecanoic acid, and ascorbic acid. The amount of the cyclic acid anhydride, phenol, or organic acid contained in the coating is preferably in the range of 0.05 to 20% by weight.

According to the present invention, the coating also comprises a developer resistance means, i.e. one or more ingredients which are capable of delaying the dissolution of the unexposed areas during processing. The dissolution inhibiting effect is preferably reduced by heating, so that the dissolution of the exposed areas is not delayed and a large dissolution differential between exposed and unexposed areas can thereby be obtained. Such developer resistance means can be added to a layer which comprises the oleophilic resin or to another layer of the material.

Such a developer resistance means may be a compound as described in e.g. EP-A 823 327 and WO97/39894 and which acts as a dissolution inhibitor due to interaction, e.g. by hydrogen bridge formation, with the alkali-soluble binder(s) in the coating. Inhibitors of this type typically comprise a hydrogen bridge forming group such as nitrogen atoms, onium groups, carbonyl (—CO—), sulfinyl (—SO—) or sulfonyl (—$SO_2$—) groups and a large hydrophobic moiety such as one or more aromatic nuclei.

Another suitable developer resistance means is a compound that improves the developer resistance because it delays the penetration of the aqueous alkaline developer into the layer comprising the oleophilic resin. Such compounds can be present in the layer itself, as described in e.g. EP-A 950 518, or in a development barrier layer on top of said layer, as described in e.g. EP-A 864 420, EP-A 950 517, WO 99/21725 and WO 01/45958. Such a barrier layer preferably comprises a polymeric material which is insoluble in or impenetrable by the developer, e.g. acrylic (co-)polymers, polystyrene, styrene-acrylic copolymers, polyesters, polyamides, polyureas, polyurethanes, nitrocellulosics, epoxy resins and silicones. In this embodiment, the solubility of the barrier layer in the developer or the penetrability of the barrier layer by the developer can be reduced by exposure to heat or infrared light. Preferred examples of such compounds which act as developer resistance means, include water-repellent polymers such as a polymer comprising siloxane and/or perfluoroalkyl units. In a typical embodiment, the precursor comprises a barrier layer which contains such a water-repellent polymer in a suitable amount between 0.5 and 25 mg/m$^2$, preferably between 0.5 and 15 mg/m$^2$ and most preferably between 0.5 and 10 mg/m$^2$. Higher or lower amounts are also suitable, depending on the hydrophobic/oleophobic character of the compound. When the water-repellent polymer is also ink-repelling, e.g. in the case of polysiloxanes, higher amounts than 25 mg/$m_2$ can result in poor ink-acceptance of the non-exposed areas. An amount lower than 0.5 mg/m$^2$ on the other hand may lead to an unsatisfactory development resistance. The polysiloxane may be a linear, cyclic or complex cross-linked polymer or copolymer. The term polysiloxane compound shall include any compound which contains more than one siloxane group —Si(R,R')—O—, wherein R and R' are optionally substituted alkyl or aryl groups. Preferred siloxanes are phenylalkylsiloxanes and dialkylsiloxanes. The number of siloxane groups in the (co)polymer is at least 2, preferably at least 10, more preferably at least 20. It may be less than 100, preferably less than 60. In another embodiment, the water-repellant polymer is a block-copolymer or a graft-copolymer of a poly(alkylene oxide) and a polymer comprising siloxane and/or perfluoroalkyl units. A suitable copolymer comprises about 15 to 25 siloxane units and 50 to 70 alkyleneoxide groups. Preferred examples include copolymers comprising phenylmethylsiloxane and/or dimethylsiloxane as well as ethylene oxide and/or propylene oxide, such as Tego Glide 410, Tego Wet 265, Tego Protect 5001 or Silikophen P50/X, all commercially available from Tego Chemie, Essen, Germany. Such a copolymer acts as a surfactant which upon coating, due to its bifunctional structure, tends to position itself at the interface between the coating and air and thereby forms a separate top layer even when applied as an ingredient of the same solution as the oleophilic resin. Simultaneously, such surfactants act as a spreading agent which improves the coating quality. Alternatively, the water-repellent polymer can be applied in a second solution, coated on top of the layer which comprises the oleophilic resin. In that embodiment, it may be advantageous to use a solvent in the second coating solution that is not capable of dissolving the ingredients present in the first layer so that a highly concentrated water-repellent phase is obtained at the top of the material.

According to the present invention, the coating also comprises an infrared light absorbing agent, which is a compound that absorbs infrared light and converts the absorbed energy into heat. The IR absorbing compound may be present in the same layer as the oleophilic resin, in the optional barrier layer discussed above or in an optional other layer. According to a preferred embodiment, the IR absorbing compound is an IR dye or IR pigment. According to another preferred embodiment, the IR absorbing compound is concentrated in or near the barrier layer, e.g. in an intermediate layer between the oleophilic and the barrier layer. According to that embodiment, said intermediate layer comprises the IR absorbing compound in an amount higher than the amount of IR absorbing compound in the oleophilic or in the barrier layer. The concentration of the IR absorbing compound in the coating is typically between 0.25 and 10.0 wt. %, more preferably between 0.5 and 7.5 wt. %. Preferred IR absorbing compounds are dyes such as cyanine and merocyanine dyes or pigments such as carbon black. Examples of suitable IR absorbers are described in e.g. EP-As 823327, 978376, 1029667, 1053868, 1093934, WO 97/39894 and 00/29214. A preferred compound is the following cyanine dye:

IR-1

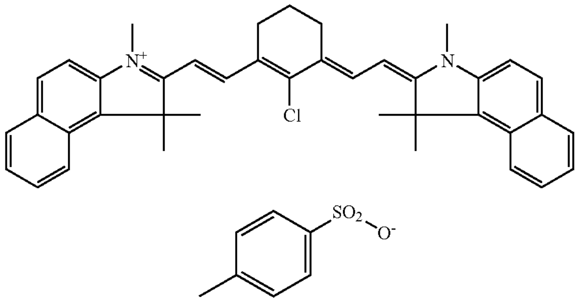

On order to protect the surface of the coating, in particular from mechanical damage, a protective layer may also optionally be applied. The protective layer generally comprises at least one water-soluble polymeric binder, such as polyvinyl alcohol, polyvinylpyrrolidone, partially hydrolyzed polyvinyl acetates, gelatin, carbohydrates or hydroxyethylcellulose, and can be produced in any known manner such as from an aqueous solution or dispersion which may, if required, contain small amounts, i.e. less than 5% by weight, based on the total weight of the coating solvents for the protective layer, of organic solvents. The thickness of the protective layer can suitably be any amount, advantageously up to 5.0 μm, preferably from 0.1 to 3.0 μm, particularly preferably from 0.15 to 1.0 μm.

Optionally, the coating and more specifically the one or more layer(s) which comprise the oleophilic resin, may further contain additional ingredients. Preferred ingredients are e.g. additional binders, especially sulfonamide and phthalimide groups containing polymers, to improve the run length and chemical resistance of the plate. Examples of such polymers are those described in EP-A 933682, EP-A 894622 and WO 99/63407. Also colorants can be added such as dyes or pigments which provide a visible color to the coating and which remain in the coating at unexposed areas so that a visible image is produced after exposure and processing. Typical examples of such contrast dyes are the amino-substituted tri- or diarylmethane dyes, e.g. crystal violet, methyl violet, victoria pure blue, flexoblau 630, basonylblau 640, auramine and malachite green.

For the preparation of the lithographic plate precursor, any known method can be used. For example, the above ingredients can be dissolved in a solvent mixture which does not react irreversibly with the ingredients and which is preferably tailored to the intended coating method, the layer thickness, the composition of the layer and the drying conditions. Suitable solvents include ketones, such as methyl ethyl ketone (butanone), as well as chlorinated hydrocarbons, such as trichloroethylene or 1,1,1-trichloroethane, alcohols, such as methanol, ethanol or propanol, ethers, such as tetrahydrofuran, glycol-monoalkyl ethers, such as ethylene glycol monoalkyl ether, e.g. 2-methoxy-1-propanol, or propylene glycol monoalkyl ether and esters, such as butyl acetate or propylene glycol monoalkyl ether acetate. It is also possible to use a mixture which, for special purposes, may additionally contain solvents such as acetonitrile, dioxane, dimethylacetamide, dimethylsulfoxide or water.

The end-user can image-wise expose the lithographic printing plate precursor directly with heat, e.g. by means of a thermal head, or indirectly by infrared light, preferably near infrared light. The infrared light is preferably converted into heat by an IR light absorbing agent as discussed above. The heat-sensitive lithographic printing plate precursor of the present invention is preferably not sensitive to visible light, i.e. no substantial effect on the dissolution rate of the coating in the developer is induced by exposure to visible light. Most preferably, the coating is not sensitive to ambient daylight, i.e. visible (400-750 nm) and near UV light (300-400 nm) at an intensity and exposure time corresponding to normal working conditions so that the material can be handled without the need for a safe light environment. “Not sensitive” to daylight shall mean that no substantial change of the dissolution rate of the coating in the developer is induced by exposure to ambient daylight. In a preferred daylight stable embodiment, the coating does not comprise photosensitive ingredients, such as (quinone)diazide or diazo(nium) compounds, photoacids, photoinitiators, sensitizers etc., which absorb the near UV and/or visible light that is present in sun light or office lighting and thereby change the solubility of the coating in exposed areas.

The printing plate precursor of the present invention can be exposed to infrared light with LEDs or a laser. Preferably, a laser emitting near infrared light having a wavelength in the range from about 750 to about 1500 nm is used, such as a semiconductor laser diode, a Nd:YAG or a Nd:YLF laser. The required laser power depends on the sensitivity of the image-recording layer, the pixel dwell time of the laser beam, which is determined by the spot diameter (typical value of modern plate-setters at $1/e^2$ of maximum intensity: 10-25 μm), the scan speed and the resolution of the exposure apparatus (i.e. the number of addressable pixels per unit of linear distance, often expressed in dots per inch or dpi; typical value: 1000-4000 dpi).

Two types of laser-exposure apparatuses are commonly used: internal (ITD) and external drum (XTD) plate-setters. ITD plate-setters for thermal plates are typically characterized by a very high scan speed up to 1500 m/sec and may require a laser power of several Watts. The Agfa Galileo T is a typical example of a plate-setter using the ITD-technology. XTD plate-setters operate at a lower scan speed typically from 0.1 m/sec to 20 m/sec and have a typical laser-output-power per beam from 20 mW up to 500 mW. The Creo Trendsetter plate-setter family (trademark of Creo) and the Agfa Excalibur plate-setter family (trademark of Agfa Gevaert N.V.) both make use of the XTD-technology.

The known plate-setters can be used as an off-press exposure apparatus, which offers the benefit of reduced press down-time. XTD plate-setter configurations can also be used for on-press exposure, offering the benefit of immediate registration in a multi-color press. More technical details of on-press exposure apparatuses are described in e.g. U.S. Pat. No. 5,174,205 and U.S. Pat. No. 5,163,368.

In the development step, the exposed areas of the coating are removed by immersion in a conventional aqueous alkaline developer, which may be combined with mechanical rubbing, e.g. by a rotating brush. During development, any water-soluble protective layer present is also removed. Silicate-based developers which have a ratio of silicon dioxide to alkali metal oxide of at least 1 are preferred to ensure that the alumina layer (if present) of the substrate is not damaged. Preferred alkali metal oxides include $Na_2O$ and $K_2O$, and mixtures thereof. In addition to alkali metal silicates, the developer may optionally contain further components, such as buffer substances, complexing agents, antifoams, organic solvents in small amounts, corrosion inhibitors, dyes, surfactants and/or hydrotropic agents as well known in the art. The development is preferably carried out at temperatures of from 20 to 40° C. in automated processing units as customary in the art. For regeneration, alkali metal silicate solutions having alkali metal contents of from 0.6 to 2.0 mol/l can suitably be used. These solutions may have the same silica/alkali metal oxide ratio as the developer (generally, however, it is lower) and likewise optionally contain further additives. The required amounts of regenerated material must be tailored to the developing apparatuses used, daily plate throughputs, image areas, etc. and are in general from 1 to 50 ml per square meter of recording material. The addition can be regulated, for example, by measuring the conductivity as described in EP-A 0 556 690.

The plate precursor according to the invention can, if required, then be post-treated with a suitable correcting agent or preservative as known in the art. To increase the resistance of the finished printing plate and hence to extend the print run, the layer can be briefly heated to elevated temperatures ("baking"). As a result, the resistance of the printing plate to washout agents, correction agents and UV-curable printing inks also increases. Such a thermal post-treatment is described, inter alia, in DE-A 14 47 963 and GB-A 1 154 749.

Besides the mentioned post-treatment, the processing of the plate precursor may also comprise a rinsing step, a drying step and/or a gumming step.

The printing plate thus obtained can be used for conventional, so-called wet offset printing, in which ink and an aqueous dampening liquid are supplied to the plate. Another suitable printing method uses so-called single-fluid ink without a dampening liquid. Single-fluid ink consists of an ink phase, also called the hydrophobic or oleophilic phase, and a polar phase which replaces the aqueous dampening liquid that is used in conventional wet offset printing. Suitable examples of single-fluid inks have been described in U.S. Pat. No. 4,045,232, U.S. Pat. No. 4,981,517 and U.S. Pat. No. 6,140,392. In a most preferred embodiment, the single-fluid ink comprises an ink phase and a polyol phase as described in WO 00/32705.

EXAMPLES

While the present invention will hereinafter be described in connection with preferred embodiments thereof, it will be understood that it is not intended to limit the invention to those embodiments.

List of Comparative Particles:

CP-01: DISPERAL OS1, an aluminum oxide particle with an average particle size of 50-70 nm, commercially available from SASOL Ltd.

CP-02: Syloid 244, a silica with hydrophilic surface and with a particle size of 3 μm, commercially available from Grace GmbH.

CP-03: Syloid 72, a silica with hydrophilic surface and with a particle size of 4.5-5.7 μm, commercially available from Grace GmbH.

CP-04: Syloid 378, a silica with hydrophilic surface and with a particle size of 4.8-6.0 μm, commercially available from Grace GmbH.

CP-05: HDK T40, a fumed silica with a particle size of 200 nm, commercially available from Wacker Chemie.

CP-06: Tospearl 105, a cross-linked silicone particle with an average particle size of 0.5 μm, commercially available from TOSHIBA SILICONE Co., Ltd.

CP-07: Hostaflon TF9202, a Teflon particle with an average particle size of 2.8 μm, commercially available from HOECHST.

CP-08: polymer particle, composed of polymethylmethacrylate (95% w/w) and methoxy-propyl-trimethoxy-silane (5% w/w), with a particle size of 3 μm, made by dispersion polymerisation and stabilized with a copolymer of styrene and maleic acid and with a polyvinlpyrrolidone.

CP-09: polymer particle, composed of polymethylmethacrylate (88% w/w), stearylmethacrylate (2% w/w) and methoxy-propyl-trimethoxy-silane (10% w/w), with a particle size of 3 μm, made by dispersion polymerisation and stabilized with a copolymer of styrene and maleic acid.

CP-10: polymer particle, composed of polymethylmethacrylate (95% w/w) and methoxy-propyl-trimethoxy-silane (5% w/w), with a particle size of 1.5 μm, made by dispersion polymerisation and stabilized with a copolymer of styrene and maleic acid and with a polyvinlpyrrolidone.

CP-11: polymer particle, composed of polymethylmethacrylate (88% w/w), stearylmethacrylate (2% w/w) and methoxy-propyl-trimethoxy-silane (10% w/w), with a particle size of 5-6 μm, made by dispersion polymerisation and stabilized with a copolymer of styrene and maleic acid.

List of Compounds and Abbreviations:

ALNOVOL SPN452 is a novolac solution, 40.5% by weight in DOWANOL PM, obtained from CLARIANT GmbH.

DOWANOL PM consist of 1-methoxy-2-propanol (>99.5%) and 2-methoxy-1-propanol (<0.5%).

S0094 is an IR absorbing cyanine dye, commercially available from FEW CHEMICALS; the chemical structure of S0094 is equal to IR-1.

BASONYL BLUE 640 is a quaternised triaryl methane dye, commercially available from BASF.

TEGOGLIDE 410 is a copolymer of polysiloxane and poly (alkylene oxide), commercially available from TEGO CHEMIE SERVICE GmbH.

TEGOWET 265 is a copolymer of polysiloxane and poly (alkylene oxide), commercially available from TEGO CHEMIE SERVICE GmbH.

Synthesis of Polymer-01:

Polymer-01 was prepared using 3 monomers, i.e. 4-(2,5-dihydro-2,5-dioxo-1H-pyrrol-1-yl)-N-(4,6-dimethyl-2-pyrimidinyl)-benzenesulfonamide (CASRN 233761-16-5) as monomer 1, benzyl maleimide (CASRN 1631-26-1) as monomer 2, and (4-hydroxy-3,5-dimethylbenzyl)methacrylamide (CASRN 104835-82-7) as monomer 3. As initiator we used a solution, 50% by weight, of 2,2-di(tert.-butyl-peroxy) butane, obtained under the trade name Trigonox D-C50 as supplied by Akzo Nobel, in a mixture isododecane/methyl ethyl ketone.

A jacketed 10 l reactor, equipped with a condenser cooled with cold water and nitrogen inlet, was filled with 651,55 g of butyrolactone. The reactor was stirred at 100 RPM using a rotor blade stirrer. Subsequently the monomers were added, i.e. 465,86 g of monomer 1, 224,07 g of monomer 2 and 294,07 g of monomer 3. The residual monomer still present in the bottles was dissolved or dispersed in 300 g butyrolactone and added to the reactor. The stirring speed was then raised to 130 RPM. Subsequently the reactor was purged with nitrogen. The reactor was heated to 140° C. during 2,5 hours and stabilized at 140° C. during 30 minutes. Afterwards the monomers were dissolved and a dark brown solution was obtained. Subsequently 36.86 g of the initiator solution, 50% by weight, were added during 2 hours. Whereas the reaction was exothermic, the reactor was cooled in order to stay at 140° C. Then the rotation speed was raised to 150 RPM. The reaction mixture was stirred for an additional 19 hours. Afterwards, the reactor content was cooled to 110° C. and the polymer solution was diluted by adding 2010 g of cold Dowanol PM over 5 minutes. Then the reactor was cooled further to room temperature and the polymer solution, 25% by weight, was collected in a drum.

Contrast Dye-01:

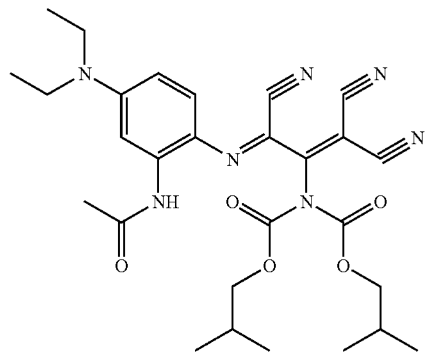

EXAMPLES 1 to 3 AND COMPARATIVE EXAMPLES 1 to 13

Preparation of Lithographic Substrate:

A 0.30 mm thick aluminum foil was degreased by immersing the foil in an aqueous solution containing 40 g/l of sodium hydroxide at 60° C. for 8 seconds and rinsed with demineralized water for 2 seconds. The foil was then electrochemically grained using an alternating current in an aqueous solution containing 12 g/l of hydrochloric acid and 38 g/l of aluminum sulphate (18 hydrate) at a temperature of 33° C. and a current density of 130 $A/dm^2$ to form a surface topography with an average center-line roughness Ra of 0.5 μm. After rinsing with demineralized water for 2 seconds, the aluminum foil was then etched with an aqueous solution containing 155 g/l of sulfuric acid at 70° C. for 4 seconds and rinsed with demineralized water at 25° C. for 2 seconds. The foil was subsequently subjected to anodic oxidation in an aqueous solution containing 155 g/l of sulfuric acid at a temperature of 45° C., at a current density of 22 $A/dm^2$ to form an anodic oxidation film of 2.90 $g/m^2$ of $Al_2O_3$, then washed with demineralized water for 2 seconds and posttreated for 10 seconds with a solution containing 4 g/l polyvinylphosphonic acid at 40° C., rinsed with demineralized water at 20° C. during 2 seconds and dried.

Preparation of Coating Solutions:

Coating solutions were prepared by mixing the following ingredients:

209.20 g of tetrahydrofuran 102.02 g of ALNOVOL SPN452

332.13 g of DOWANOL PM 266.20 of methyl ethyl ketone 2.10 g of S0094

53.00 g of a solution of BASONYL BLUE 640, added as a solution of 1% by weight in DOWANOL PM 8.50 g of a solution of TEGOGLIDE 410, added as a solution of 1% by weight in DOWANOL PM 21.55 g of a solution of TEGOWET 265, added as a solution of 1% by weight in DOWANOL PM 5.30 g of 3,4,5-trimethoxy cinnamic acid amount in g of a particle as listed in Table 1, is added and subsequently dispersed in the coating solution by means of an Ultra-Turrax high speed mixer.

Preparation of Printing Plate Precursors:

Printing plate precursors were produced by coating the coating solution as indicated in Table 1 onto the above described lithographic substrate. Each coating solution was applied at a wet coating thickness of 23.4 μm and then dried at 135° C. Depending on the added amount of particles in the coating solution as indicated in Table 1, the dry coating thickness varied between 1.16 $g/m^2$ and 1.26 $g/m^2$.

Exposure:

The printing plate precursors were exposed on a CreoScitex Trendsetter 3244 at a drum speed of 150 rpm and the energy density on the plate precursor was 130 $mJ/cm^2$.

Processing:

The imagewise exposed printing plate precursors were processed in an Agfa Autolith T processor, operating at a speed of 0.96 m/min and at 25° C., and using Agfa TD5000 as developer and RC795, commercially available from AGFA, as gum.

Printing:

The processed plates were used as a print master on a Heidelberg GTO52 printing press using K+E 800 Skinnex Black, commercially available from BASF, as ink and Rotamatic, commercially available from Unigraphica GmbH, as fountain solution. The plates were printed to evaluate the quality of the coating and the lithographic properties of the plate (lithographic differentiation, appearance of toning in the non-image areas).

Test Method for Measuring Scuff-mark Resistance:

Printing plate precursors as prepared above were packed by 20 plates 0.30 gauge per package with the interleave in between each plate and on top of topmost plate. On top of topmost interleave a cardboard was present and underneath the first plate a polypropylene support, 2 mm thickness, was present. The whole was wrapped in wrapping paper and closed with tape, resulting in a void volume on the sides of the plates in the package. This void volume corresponds with the free volume which enables a fast automatic packaging in boxes. On vibration, the plates and interleaves were able to move relatively to each other over a distance of 3 to 4 mm. The interleave used in this test is Hoffmann & Engelmann Interleaving 37 gsm Plain Bleached Kraft, commercially available from Hoffmann & Engelmann AG, Neustadt, Germany. The carboard used in this test is a Deisweil Carboard 350 gsm, commercially available from DEISWIL, Switzerland.

To simulate the transport test, the package was vibrated 2 times for 30 minutes. The vibration has a frequency of 1.5 Hz and an amplitude of 12 mm. During this vibration the plates and interleaves were moved relatively to each other whereby the upside coating can be damaged by mechanical action. These surface destructions induce an increased solubility of the coating in the developer during processing.

The SMR (scuff-mark resistance) is rated in four levels, depending on the size and number of the scratches on the plate: rating 1 means an excellent SMR, i.e. practically no destructions are present; rating 2 means a good SMR, i.e. only a few number of small destructions are present; rating 3 means a fair SMR, i.e. some destructions are present, but the number and size are sufficiently low and this rating is still acceptable for a printing plate; rating 4 means a poor SMR, i.e. a high number and/or a large size of destructions are present, this rating is unacceptable for a printing plate application. The ratings for the SMR are indicated in Table 1.

TABLE 1

| Example number | Particle Type | Particle Average particle size (μm) | Particle Amount added (g) | Particle Conc. ($mg/m^2$) | SMR (scuff-mark resistance) (rating 1 to 4) |
|---|---|---|---|---|---|
| Comparative Example 1 | — | — | 0 | 0 | 4 |
| Comparative Example 2 | CP-01 | 0.5-0.7 | 4.32 | 100 | b |
| Comparative Example 3 | CP-02 | 3 | 4.32 | 100 | c |
| Comparative Example 4 | CP-03 | 4.5-5.7 | 4.32 | 100 | c |
| Comparative Example 5 | CP-04 | 4.8-6.0 | 4.32 | 100 | c |
| Comparative Example 6 | CP-05 | 0.2 | 4.32 | 100 | a |
| Comparative Example 7 | CP-06 | 0.5 | 1.73 | 40 | 4 |
| Comparative Example 8 | CP-07 | 2.8 | 4.32 | 100 | 4 |
| Comparative Example 9 | CP-08 | 3 | 2.16 | 50 | c |
| Comparative Example 10 | CP-08 | 3 | 4.32 | 100 | c |
| Comparative Example 11 | CP-09 | 3 | 4.32 | 100 | a |
| Comparative Example 12 | CP-10 | 1.5 | 4.32 | 100 | c |
| Comparative Example 13 | CP-11 | 5-6 | 4.32 | 100 | b |
| Example 1 | P-01 | 3.5 | 4.32 | 100 | 1 |
| Example 2 | P-01 | 3.5 | 1.73 | 40 | 1 |
| Example 3 | P-02 | 1 | 4.32 | 100 | 1 |

(a) No uniform coating layer on the plate was obtained due to flocculation of the coating solution, caused by the addition of spacer particles.
(b) No lithographic differentiation between the printing and non-printing areas was obtained.
(c) Poor lithographic differentiation between the printing and non-printing areas caused by an insufficient removement of the coating layer in the exposed image areas during processing (i.e. toning).

The Examples in Table 1 demonstrate that the addition of aluminum hydroxide spacer particles having a particle size of 3.5 μm and of aluminum oxide spacer particles having a particle size of 1 μm, gives rise to a significant improvement of the scuff-mark resistance compared with the coatings wherein no particles are present or wherein very small aluminum oxide particles, having a particle size of 0.05-0.07 μm, or wherein Teflon particles are present. The addition of Syloid-type particles or of polymeric particles gives rise to printing plates which suffer from a limit lithographic differentation (toning) or from no differentiation at all.

EXAMPLES 4 to 6 AND COMPARATIVE EXAMPLE 14

Preparation of lithographic substrate was the same as described in Example 1.

Preparation of Coating Solutions:

Coating solution were prepared by mixing the following ingredients:

207.94 g of tetrahydrofuran
77.07 g of ALNOVOL SPN452
53.37 g of Polymer-01, added as a solution of 25% by weight in a mixture of 1 part by weight butyrolactone and 2 parts by weight Dowanol PM
218.15 g of DOWANOL PM
264.69 of methyl ethyl ketone
1.29 g of S0094
150.40 g of Contrast Dye-01, added as a solution of 1% by weight in DOWANOL PM
21.47 g of TEGOGLIDE 410, added as a solution of 1% by weight in DOWANOL PM
3.44 g of 3,4,5-trimethoxy cinnamic acid
amount in g of a particle as listed in Table 2, is added and subsequently dispersed in the coating solution by means of an Ultra-Turrax high speed mixer.

Preparation of Printing Plate Precursors:

Printing plate precursors were produced, in the same way as described in Example 1, by coating the coating solution as indicated in Table 2 onto the above described lithographic substrate.

Exposure, processing, printing, simulation test for transport test and measuring suff marks, and measuring the friction coeficients were carried out in the same way as described in Example 1. The results are given in Table 2.

TABLE 2

| Example number | Particle Type | Particle Average particle size (μm) | Particle Amount added (g) | Conc. ($mg/m^2$) | SMR (scuff-mark resistance) (rating 1 to 4) |
|---|---|---|---|---|---|
| Comparative Example 14 | — | — | 0 | 0 | 4 |
| Example 4 | P-01 | 3.5 | 1.73 | 40 | 3 |
| Example 5 | P-02 | 1 | 1.73 | 40 | 3 |
| Example 6 | P-02 | 1 | 0.432 | 10 | 3 |

The Examples in Table 2 demonstrate that, for a coating comprising Polymer-01 (containing sulphonamide groups), the addition of aluminum hydroxide spacer particles, having a particle size of 3.5 μm and of aluminum oxide spacer particles, having a particle size of 1 μm, gives rise to a significant improvement of the scuff-mark resistance compared with the coating wherein no particles are present.

The invention claimed is:

1. A positive working heat-sensitive lithographic printing plate precursor comprising a support having a hydrophilic surface and a coating provided on the hydrophilic surface, said coating comprising:

(a) an infrared light absorbing agent,
(b) an oleophilic resin soluble in an aqueous alkaline developer,
(c) a developer resistance means; and
(d) spacer particles, wherein said spacer particles comprise aluminum hydroxide or aluminum oxide and have an average particle size larger than 0.4 μm, wherein the coating has a surface and the average particle size is selected so that a portion of a plurality of the spacer particles extend beyond the surface of the coating, and wherein the amount of said particles in the coating is between 5 and 200 $mg/m^2$.

2. A positive working heat-sensitive lithographic printing plate precursor according to claim 1 wherein said particle size is between 0.5 μm and 20 μm.

3. A positive working heat-sensitive lithographic printing plate precursor according to claim 2, wherein said coating has a layer thickness comprised between 0.6 $g/m^2$ and 2.8 $g/m^2$.

4. A positive working heat-sensitive lithographic printing plate precursor according to claim 3, wherein said coating comprises at least two layers and wherein said spacer particles are present in at least one of the layers of the coating.

5. A positive working heat-sensitive lithographic printing plate precursor according to claim 4, wherein said developer resistance means is a polymer comprising siloxane or perfluoroalkyl units.

6. A positive working heat-sensitive lithographic printing plate precursor according to claim 1 wherein said particle size is between 1 μm and 7 μm.

7. A positive working heat-sensitive lithographic printing plate precursor according to claim 6, wherein said coating has a layer thickness comprised between 0.6 $g/m^2$ and 2.8 $g/m^2$.

8. A positive working heat-sensitive lithographic printing plate precursor according to claim 1 wherein said coating has a layer thickness comprised between 0.6 $g/m^2$ and 2.8 $g/m^2$.

9. A positive working heat-sensitive lithographic printing plate precursor according to claim 1 wherein said coating comprises at least two layers and wherein said spacer particles are present in at least one of the layers of the coating.

10. A positive working heat-sensitive lithographic printing plate precursor according to claim 5, wherein said developer resistance means is a polymer comprising siloxane or perfluoroalkyl units.

11. A positive working heat-sensitive lithographic printing plate precursor according to claim 1 wherein said developer resistance means is a polymer comprising siloxane or perfluoroalkyl units.

12. A stack comprising a plurality of positive working heat-sensitive lithographic printing plate precursors, according to claim 1, wherein adjacent plate precursors are separated by an interleave.

13. A package comprising a stack according to claim 12.

14. A process for improving the scuff-mark resistance of a positive working heat-sensitive lithographic printing plate precursor comprising providing a support having a hydrophilic surface and applying onto the hydrophilic surface of the support a coating comprising:

(a) an infrared light absorbing agent, (b) an oleophilic resin soluble in an aqueous alkaline developer, (c) a developer resistance means; and (d) spacer particles, wherein said spacer particles comprise aluminum hydroxide or aluminum oxide and have an average particle size larger than 0.4 μm, wherein the coating has a surface and the average particle size is selected so that a portion of a plurality of the spacer particles extend beyond the surface of the coating, and wherein the amount of said particles in the coating is between 5 and 200 $mg/m^2$.

* * * * *